US007169256B2

(12) United States Patent
Dhindsa et al.

(10) Patent No.: US 7,169,256 B2
(45) Date of Patent: Jan. 30, 2007

(54) PLASMA PROCESSOR WITH ELECTRODE RESPONSIVE TO MULTIPLE RF FREQUENCIES

(75) Inventors: Raj Dhindsa, San Jose, CA (US); Felix Kozakevich, Sunnyvale, CA (US); David Douglas Trussell, Fremont, CA (US)

(73) Assignee: LAM Research Corporation, Fremont, CA (US)

( * ) Notice: Subject to any disclaimer, the term of this patent is extended or adjusted under 35 U.S.C. 154(b) by 93 days.

(21) Appl. No.: 10/855,706

(22) Filed: May 28, 2004

(65) Prior Publication Data

US 2005/0264218 A1    Dec. 1, 2005

(51) Int. Cl.
*H01L 21/306*    (2006.01)

(52) U.S. Cl. .............................. 156/345.47; 118/723 E; 315/111.21

(58) Field of Classification Search ........... 315/111.21, 315/111.71, 111.41, 111.51; 156/345.24, 156/345.47, 345.43, 345.44; 118/723 E, 118/723 I
See application file for complete search history.

(56) References Cited

U.S. PATENT DOCUMENTS

| 5,556,549 | A | * | 9/1996 | Patrick et al. ......... 156/345.28 |
| 5,897,713 | A | * | 4/1999 | Tomioka et al. ........ 315/111.51 |
| 6,071,372 | A | * | 6/2000 | Ye et al. ................. 156/345.48 |
| 6,127,278 | A | | 10/2000 | Wang et al. ................. 438/719 |
| 6,153,068 | A | * | 11/2000 | Ohmi et al. ........... 204/298.06 |
| 6,303,510 | B1 | | 10/2001 | Chien et al. ................. 438/710 |
| 6,387,287 | B1 | | 5/2002 | Hung et al. ................... 216/67 |
| 6,485,602 | B1 | * | 11/2002 | Hirose ................... 156/345.44 |
| 6,506,674 | B1 | | 1/2003 | Ikeda et al. ................. 438/637 |
| 6,849,154 | B1 | * | 2/2005 | Nagahata et al. ...... 156/345.47 |

\* cited by examiner

*Primary Examiner*—Tuyet Vo
*Assistant Examiner*—Ephrem Alemu
(74) *Attorney, Agent, or Firm*—Lowe, Hauptman & Berner, LLP

(57) ABSTRACT

A plasma processor processing a workpiece includes sources having frequencies 2 MHz, 27 MHz, and 60 MHz, applied by three matching networks to an electrode in a vacuum chamber including the workpiece. Alternatively 60 MHz is applied to a second electrode by a fourth matching network. The matching networks, substantially tuned to the frequencies of the sources driving them, include series inductances so the 2 MHz inductance exceeds the 27 MHz network inductance, and the 27 MHz network inductance exceeds the inductances of the 60 MHz networks. The matching networks attenuate by at least 26 DB the frequencies of the sources that do not drive them. Shunt inductors between the 27 and 60 MHz sources decouple 2 MHz from the 27 and 60 MHz sources. A series resonant circuit (resonant to about 5 MHz) shunts the 2 MHz network and the electrode to help match the 2 MHz source to the electrode.

63 Claims, 5 Drawing Sheets

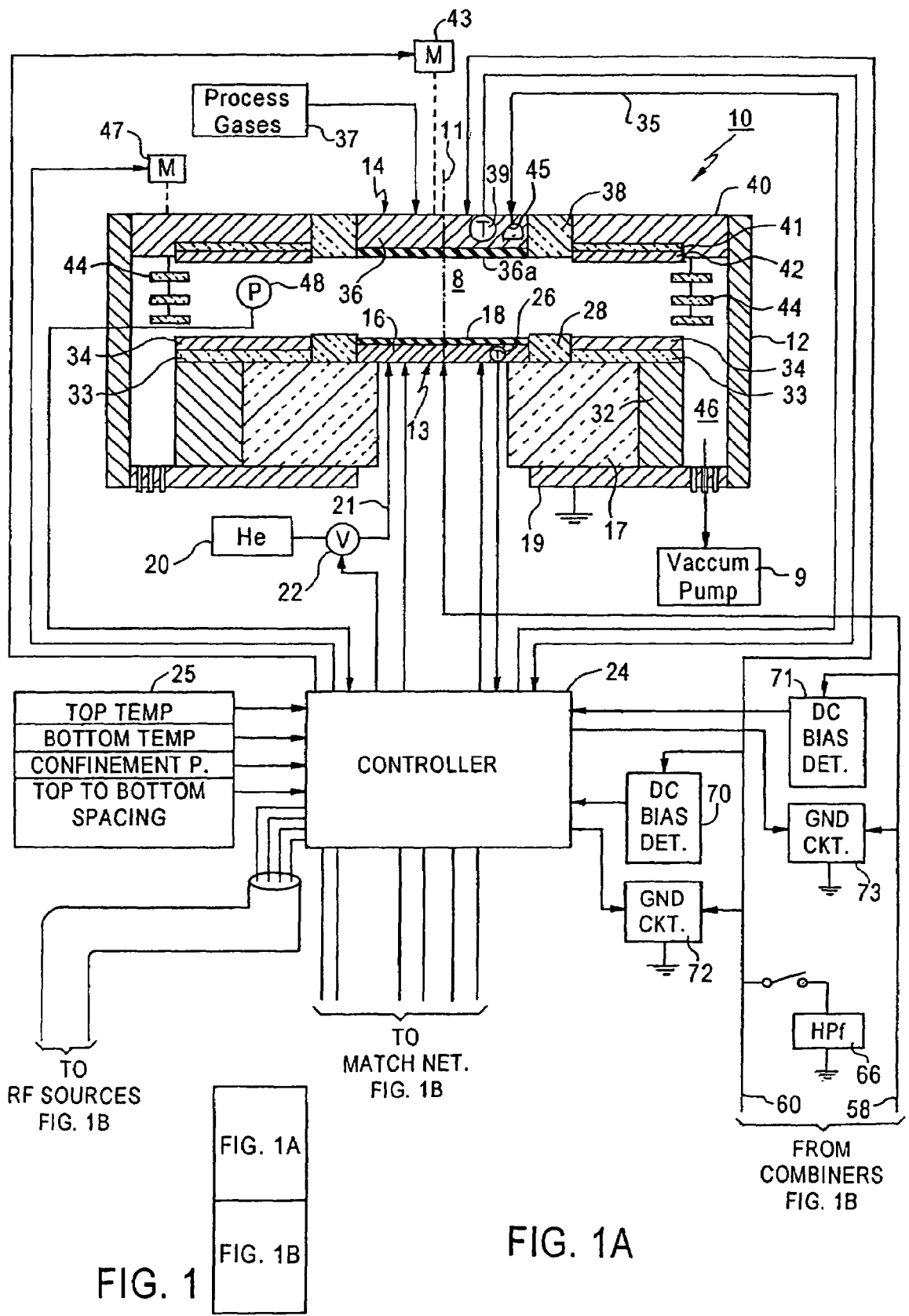

PLASMA PROCESSOR WITH ELECTRODE RESPONSIVE TO MULTIPLE RF FREQUENCIES

RELATION TO COPENDING APPLICATION

The present invention is an improvement on the invention disclosed in the copending, commonly assigned application Multiple Frequency Plasma Etch Reactor, invented by Rajinder Dhindsa, et al. U.S. Ser. No. 10/645,665, filed Aug. 22, 2003, incorporated herein by reference. The present invention is also related to the invention disclosed in the commonly assigned, simultaneously filed application of Dhindsa et al., entitled "VACUUM PLASMA PROCESSOR INCLUDING CONTROL IN RESPONSE TO DC BIAS VOLTAGE", Ser. No. 10/855,707. The present invention, at the time it was made, was owned by the owner of the copending applications.

FIELD OF INVENTION

The present invention relates generally to an apparatus for processing a workpiece with a plasma in a plasma processing chamber and more particularly to a processor having a single electrode connected to be responsive to electric energy at several (i.e., three more, but not many) frequencies.

BACKGROUND ART

It is known to apply plasma excitation fields at two different frequencies to a region of a vacuum chamber for plasma processing a workpiece, wherein the region is coupled to a gas that the fields convert into the processing plasma. The workpiece is usually a semiconductor wafer, or dielectric plate and the plasma is involved in forming integrated circuit features on the workpiece. High frequency RF power (having a frequency in excess of approximately 10 MHz) typically controls the density of the plasma, i.e., the plasma flux, while RF power having a low to medium frequency (in the range of 100 kHz to approximately 10 MHz) typically controls the energy of ions in the plasma and incident on the workpiece. The excited plasma in these processors typically dry etches the workpiece, but in some instances results in materials being deposited on the workpiece. Typically, the AC plasma excitation fields are supplied to the region by a pair of spaced electrodes in the chamber or one electrode in the chamber and a coil, located outside the chamber. (It is to be understood that the term "reactance", when used in the present document in connection with a vacuum plasma processing chamber, refers to an electrode or a coil for supplying AC plasma excitation fields to a plasma in the chamber.)

The commonly assigned, copending application of Vahedi et al., Ser. No. 10/180,978, filed Jun. 27, 2002 discloses a processor wherein two different frequencies are simultaneously applied to a vacuum plasma processing chamber bottom electrode (i.e., the electrode on which a workpiece being processed is disclosed), while a top electrode of the chamber is grounded.

As the size of the features continues to decrease, there are increased requirements for precise control of various parameters of the plasma processing a workpiece. Amongst the plasma parameters requiring precise control are the plasma chemistry (i.e., types of ionic and radical species), the plasma flux and the ion energy of the plasma incident on the substrate. With the shrinking feature sizes and use of new materials in fabrication of integrated circuits, windows involved in processing the workpiece are decreasing in size, while pushing the limits on presently available plasma processors, particularly processors for etching. The shrinking feature sizes and requirements for new materials limit the use of the same reactor, i.e., vacuum processing chamber, for different etch applications.

The copending Dhindsa et al. application provides these results by exciting the plasma with electric energy at several frequencies, such that excitation of the plasma by the several frequencies simultaneously causes several different phenomena to occur in the plasma. By exciting the plasma with electric energy at three different frequencies, such as approximately 2 MHz, 27 MHz and 60 MHz, precise control of the chemistry, density and ion energy of the plasma for processing a workpiece is provided. In one embodiment of the co-pending Dhindsa et al. application, a plasma excitation source arrangement applies several frequencies to the bottom electrode, while a top electrode, opposite from the bottom electrode, is grounded. The plasma excitation source arrangement of the co-pending Dhindsa et al. application includes a broad disclosure of circuitry for (1) providing an impedance match between sources of the frequency and the plasma, and (2) decoupling the frequencies associated with the different sources from each other. The plasma resulting from the source arrangement of the co-pending Dhindsa et al. application can include at least one variable frequency RF source, at least one fixed frequency RF source, and at least one variable power RF source.

SUMMARY OF THE INVENTION

According to one aspect of the present invention, a vacuum plasma processor for a workpiece comprises a vacuum plasma processing chamber including an electrode. The chamber is associated with a reactance. The electrode and reactance are arranged for coupling plasma excitation fields to gas in the chamber that is arranged for carrying a workpiece. The processor includes N sources of radio frequency electric power, where N is an integer having a value of at least three, and each of the sources is arranged for deriving a different radio frequency. The processor also includes circuitry for supplying electric power at the N frequencies from the N sources of radio frequency electric power to the electrode and reactance. The N frequencies, the power at each of the N frequencies, the electrode, the reactance, and the circuitry are arranged for (a) causing the plasma to be excited to each of the N frequencies and (b) preventing substantial coupling of power to each of said N sources at a frequency other than the frequency associated with the particular radio frequency of the source. The N frequencies and the circuitry are arranged such that at least 26 DB of power attenuation is inserted by the circuitry for preventing substantial coupling of power to each of said N sources at a frequency other than the frequency associated with the particular radio frequency of the source.

We have found through experimentation that at least 26 DB of power attenuation is preferably provided to enable the desired decoupling of each of the sources from the frequencies of the other sources. The 26 DB of power attenuation prevents harmonics and intermodulation components (i.e., the sum and difference frequencies of the various different frequency sources) due to nonlinearities of the plasma from being coupled back to the output impedance of the sources.

Another aspect of the present invention relates to a vacuum plasma processor for a workpiece comprising a vacuum plasma processing chamber including an electrode.

The chamber is associated with a reactance. The electrode and reactance are arranged for coupling plasma excitation fields to gas in the chamber that is arranged for carrying a workpiece. The processor includes N sources of radio frequency electric power, where N is an integer having a value of at least three. Each of the sources is arranged for deriving a different radio frequency such that source i is arranged to derive a radio frequency Fi, where i is sequentially each integer from 1 to N, F1 is less than FN, and i increases monotonically from 1 to N. The processor also includes circuitry for supplying electric power at the N frequencies from the N sources of radio frequency electric power to the electrode and reactance. The N frequencies, the power at each of the N frequencies, the electrode, the reactance, and the circuitry are arranged for (a) causing the plasma to be excited to each of the N frequencies and (b) preventing substantial coupling of power to each of said N sources at a frequency other than the frequency associated with a particular radio frequency source. The circuitry includes N impedance matching networks, each of which is associated with one of the sources and arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network. Each impedance matching network has a series inductance. The series inductance of the impedance matching network associated with source i is less than the series inductance of each of the impedance matching networks 1 to (i−1). Such a relationship in the series inductances of the N matching networks assists in providing the desired decoupling of each of the sources from the frequencies of the other sources.

A further aspect of the present invention relates to a vacuum plasma processor for a workpiece comprising a vacuum plasma processing chamber including an electrode. The chamber is associated with a reactance. The electrode and reactance are arranged for coupling plasma excitation fields to gas in the chamber that is arranged for carrying a workpiece. The processor includes N sources of radio frequency electric power, where N is an integer having a value of at least three. Each of the sources is arranged for deriving a different radio frequency such that source i is arranged to derive a radio frequency Fi, where i is sequentially each integer from 1 to N, F1 is less than FN, and i increases monotonically from 1 to N. The processor also includes circuitry for supplying electric power at the N frequencies from the N sources of radio frequency electric power to the electrode and reactance. The N frequencies, the power at each of the N frequencies, the electrode, the reactance, and the circuitry are arranged for (a) causing the plasma to be excited to each of the N frequencies and (b) preventing substantial coupling of power to each of said N sources at a frequency other than the frequency associated with the particular radio frequency source. The circuitry includes N impedance matching networks, each of which is associated with one of the sources and arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network. The circuitry for supplying electric power includes a series resonant circuit connected in shunt between the electrode and the impedance matching network associated with the source having frequency F1. The series resonant circuit has a frequency between F1 and F2 so as to have no substantial effect on the power coupled to the plasma at any of the frequencies above F1 while assisting in providing impedance matching of the source having the frequency F1 to parasitic impedance associated with the electrode.

An additional aspect of the invention relates to a vacuum plasma processor for a workpiece comprising a vacuum plasma processing chamber including an electrode. The chamber is associated with a reactance. The electrode and reactance are arranged for coupling plasma excitation fields to gas in the chamber that is arranged for carrying a workpiece. The processor includes N sources of radio frequency electric power, where N is an integer having a value of at least three. Each of the sources is arranged for deriving a different radio frequency such that source i is arranged to derive a radio frequency Fi, where i is sequentially each integer from 1 to N, F1 is less than FN, and i increases monotonically from 1 to N. The processor also includes circuitry for supplying electric power at the N frequencies from the N sources of radio frequency electric power to the electrode and reactance. The N frequencies, the power at each of the N frequencies, the electrode, the reactance, and the circuitry are arranged for (a) causing the plasma to be excited to each of the N frequencies and (b) preventing substantial coupling of power to each of said N sources at a frequency other than the frequency associated with a particular radio frequency source. The circuitry includes N impedance matching networks, each of which is associated with one of the sources and arranged for (a) coupling plasma excitation power at the frequency of the source with which it is associated to the electrode and (b) attenuating power at the frequencies of the other sources sufficiently to prevent power at the frequencies of the other sources from being coupled to the source associated with the matching network. The circuitry for supplying electric power includes (N−1) filters respectively associated with the sources 2 to N. The (N−1) filters are respectively arranged for enabling electric power from the sources 2 to N to be coupled without substantial attenuation to the electrode or reactance while substantially attenuating power from source 1 and for preventing power from source 1 from being coupled to sources 2 to N.

A still further aspect of the present invention relates to a vacuum plasma processor for a workpiece comprising a vacuum plasma processing chamber including an electrode. The chamber is associated with a reactance. The electrode and reactance are arranged for coupling plasma excitation fields to gas in the chamber that is arranged for carrying a workpiece. The processor includes N sources of radio frequency electric power, where N is an integer having a value of at least three. Each of the sources is arranged for deriving a different radio frequency such that source i is arranged to derive a radio frequency Fi, where i is sequentially each integer from 1 to N, F1 is less than FN, and i increases monotonically from 1 to N. The processor also includes circuitry for supplying electric power at the N frequencies from the N sources of radio frequency electric power to the electrode and reactance. The N frequencies, the power at each of the N frequencies, the electrode, the reactance, and the circuitry are arranged for (a) causing the plasma to be excited to each of the N frequencies and (b) preventing substantial coupling of power to each of said N sources at a frequency other than the frequency associated with a particular radio frequency source. The circuitry includes (N+k) impedance matching networks, where k is an integer less than N. Each of the N matching networks is associated with one of the sources and arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network. Each of the k impedance matching networks is associated with one of k of the sources and arranged for (a) coupling plasma excitation power at the frequency of the source with which it is associated to the reactance, and (b) attenuating power at the frequencies of the other (k−1) sources sufficiently to prevent substantial coupling of power at the frequencies of the other (k−1) sources to the particular source associated with the matching network. A switching arrangement supplies power (1) from the N sources to the electrode via the N matching networks or (2) from (a) j of the k sources to the reactance via j of the matching networks and (b) m of the sources to the electrode via m of the matching networks, where j is any integer from 1 to k and m is any integer from one to (N−k).

The circuitry can be arranged to supply at least three of the N frequencies to the electrode.

Preferably, N=3 and there are first, second and third frequencies (F1, F2, and F3) such that F1 is the lowest frequency, F3 is the highest frequency, and F2 is between F1 and F3. F1, F2, and F3 are such that there is at least a one octave difference between adjacent pairs of said first, second and third frequencies to assist in providing the desired decoupling of each of the sources from the frequencies of the other sources. In addition, the second frequency is preferably at least one decade higher than the first frequency because the power at the first frequency is typically substantially higher than the power at the second frequency. In the preferred embodiment (where N=3), j=k=1, m=2.

Use of (N+k) matching networks is advantageous over the use of only N matching networks. The (N+k) matching networks enable a source to drive the electrode under a first circumstance via a first matching network and drive the reactance via a second matching network under a second circumstance. With such an arrangement, the source can to be more easily and quickly matched than if only N matching networks are used and the source alternately drives the electrode and reactance via the same matching network.

Each of the impedance matching networks preferably includes a capacitance arrangement and an inductance tuned substantially to the frequency of the source associated with a particular one of the matching networks. In particular, each of the impedance matching networks preferably includes a shunt capacitor, a series capacitor and the inductance. The inductances of the matching networks associated with relatively low frequency sources are lumped parameter inductors, while the inductances of the matching networks associated with higher frequencies sources are typically distributed, parasitic inductances.

In the preferred embodiments, the sources have frequencies of approximately 2 MHz, 27 MHz and 60 MHz. In this case, the series resonant circuit has a resonant frequency of approximately 5 MHz so as to have no substantial effect on the power coupled to the plasma at either 27 MHz or 60 MHz, while assisting in providing impedance matching of the 2 MHz source to the parasitic impedance associated with the electrode.

The sources, in one embodiment, have a variable frequency within a relatively narrow range. In such an embodiment, the shunt capacitor of the associated impedance matching network is variable in a range for providing desired workpiece processing results. The variable frequency is controlled by a controller including a sensor for determining the degree of impedance matching between (1) the output impedance of the source associated with the impedance matching network and (2) the impedance driven by the source. Each source usually includes such a controller. In a second embodiment, the sources have fixed frequencies, in which case the shunt and series capacitors of the associated impedance matching network are variable and controlled by a controller including a sensor for determining the degree of impedance matching between (1) the output impedance of the source associated with the impedance matching network and (2) the impedance driven by the source.

Preferably, each of the filters includes an inductor connected in shunt between the source associated with the filter and the impedance matching network associated with the source.

In a preferred embodiment, a switching arrangement selectively supplies power from at least one of the sources to the initially mentioned electrode or to the reactance, preferably a second electrode spaced from the initially mentioned electrode.

The above and still further objects, features and advantages of the present invention will become apparent upon consideration of the following detailed description of specific embodiments thereof, especially when taken in conjunction with the accompanying drawings.

DETAILED DESCRIPTION OF THE DRAWING

Figure 1B:
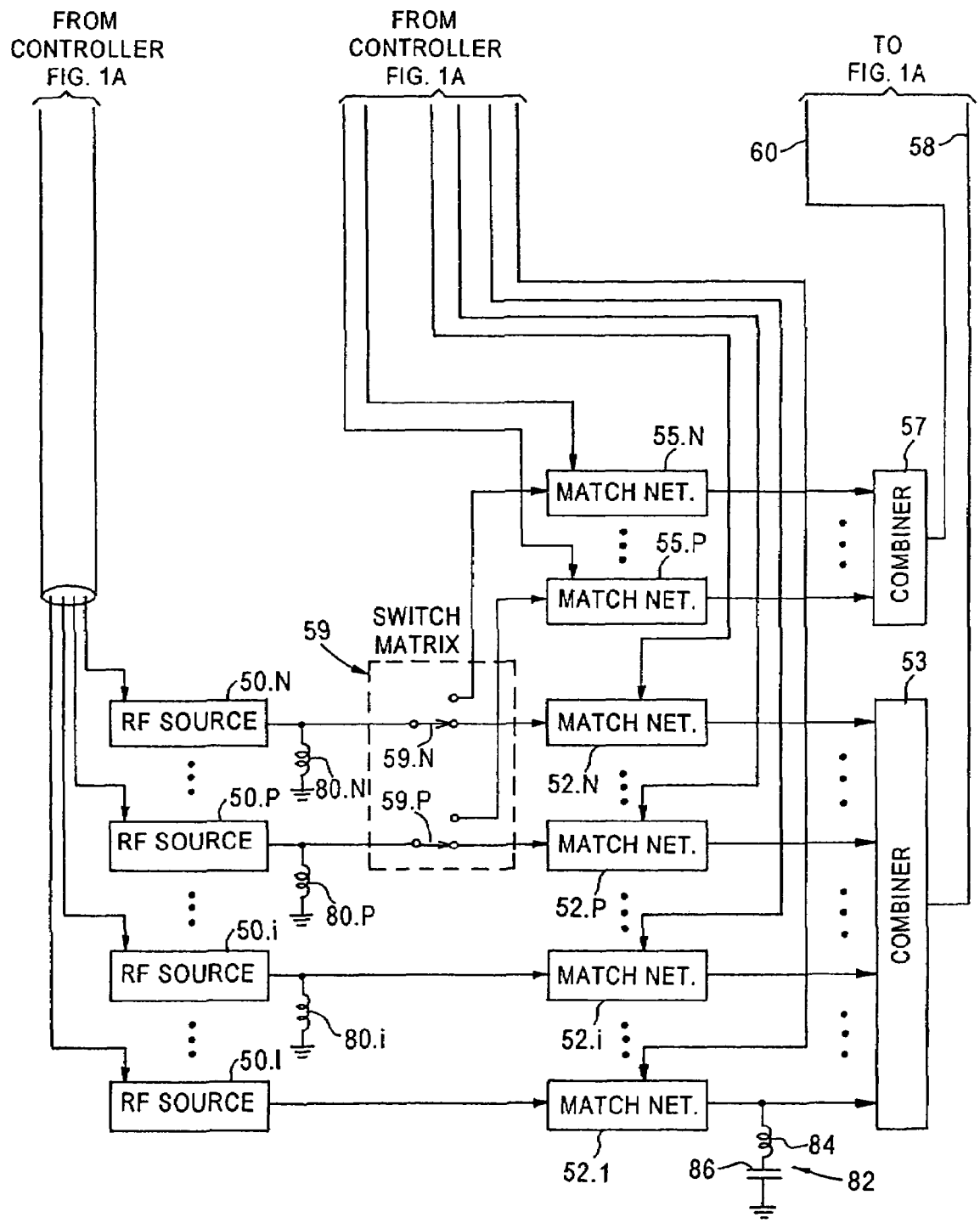
FIG. 1 is a partial block and partial electric schematic diagram of a vacuum plasma processor including aspects of the present invention.

Reference is now made to FIG. 1 of the drawing wherein plasma processor vacuum chamber 10, having longitudinal axis (i.e., centerline) 11 is illustrated as including electrically conductive metal wall 12, bottom electrode assembly 13 and top electrode assembly 14. Wall 12 has a circular inner periphery, coaxial with axis 11. Wall 12 is grounded, i.e., at DC and RF reference potentials. Vacuum pump 9 maintains the interior of chamber 10 at a vacuum on the order of 0.001 to 500 torr during processing. The interior of chamber 10 includes confined plasma region 8 between a bottom boundary close to the top face of bottom electrode assembly 13 and a top boundary close to the bottom face of top electrode assembly 14; the side boundary of confined plasma region 8 is spaced from wall 12.

Bottom electrode assembly 13, frequently referred to as a bottom electrode, is coaxial with axis 11 and is secured to electric insulating ring 17, which in turn is secured to metal, grounded base 19 of chamber 10. Electrode assembly 13 includes circular, central metal electrode 16 that is coaxial with axis 11 and has an upper surface for receiving a circular workpiece 18, typically a semiconductor wafer having a diameter substantially equal to the diameter of metal electrode 16. When workpiece 18 is properly in place its center is coincident with axis 11. Electrode 16 can be connected to a DC chucking voltage source (not shown) for clamping workpiece 18 to electrode 16 using electrostatic forces. The temperature of electrode 16 and workpiece 18 is controlled in a manner known to those skilled in the art by connecting helium source 20 to a region (not shown) in electrode 16 by way of conduit 21 and valve 22, responsive to an electric signal that controller 24 derives in response to (1) a temperature set point supplied to the controller by set point source 25 and (2) a measure of the temperature in the electrode, as indicated by a signal derived by temperature monitor 26 embedded in electrode 16.

Bottom electrode assembly 13 also includes electric insulator ring 28, typically made of quartz. Ring 28 is secured to the top face of insulator ring 17, is coaxial with axis 11 and has an inner diameter substantially equal to the diameter of workpiece 18 so that the periphery of workpiece 18, when the workpiece is properly in place, almost abuts the inner periphery of ring 28. The portion of the top face of ring 17 outside ring 28 and the side wall of ring 17 are covered by insulator ring 33 and grounded metal ring 32, respectively. Insulating ring 33 is overlaid by metal electrode ring 34 that can be covered or coated with a layer (not shown) of dielectric or conductive material. Electrically conductive ring 34 and the layer that covers or coats it are made of a material that does not contaminate the chemistry of the plasma in region 8. Such a material is a suitable relatively high conductivity semiconductor, e.g., intrinsic silicon. Alternatively, ring 34 is a metal covered by a suitable non-contaminating material. Ring 34 is electrically connected to grounded ring 32 by a metal strap (not shown) so that ring 34 is grounded. Rings 33 and 34 are coaxial with axis 11, and extend horizontally between the outer edge of bottom electrode assembly 13 and ring 28. Ring 34 preferably has an area facing region 8 equal to or greater than the area of electrode 16 to assist in having the correct ion energy of plasma incident on the workpiece.

Top electrode assembly 14 includes central electrode 36, coaxial with axis 11 and having a bottom face 36a made of electrically conductive intrinsic silicon that does not contaminate the chemistry of the plasma in region 8. Electrode 36 includes internal passages (not shown) and numerous showerhead openings (not shown), both connected in fluid flow relation to a suitable source 37 of process gases that flow through the showerhead openings into region 8 where the gases are converted into a plasma that processes workpiece 18. Electrode 36 includes a heating and/or cooling arrangement 45 responsive to an electric signal that controller 24 supplies to arrangement 45 via lead 35 in response to a set point signal supplied to the controller by set point source 25, as well as a signal indicative of the temperature of electrode 36, as derived by temperature gauge 39, embedded in assembly 14.

Assembly 14 also includes insulator ring 38 and metal ring 40. Ring 38 is coaxial with axis 11, preferably made of quartz and approximately aligned with ring 28. Ring 38 has an inner periphery abutting the outer periphery of central electrode 36. Metal ring 40, coaxial with axis 11, has inner and outer peripheries respectively abutting the outer periphery of insulator ring 38 and the inner periphery of side wall 12 so that ring 40 is at RF and DC ground potential. The lower, inner face of metal ring 40 is covered by electrical insulating ring 41 that carries an electrically conductive electrode ring 42. Electrode ring 42 is either coated or covered with a layer (not shown) of conductive or insulating material that does not contaminate the chemistry of the plasma in region 8. Ring 42 is electrically connected to ring 40 and wall 12 by a metal strap (not shown) so that ring 42 is grounded. Preferably the areas of electrodes 16 and 36 facing region 8 are the same, and the areas of grounded rings 34 and 42 are the same, so the area of ring 42 is equal to or greater than the area of electrode 36. Electrodes 16 and 36, as well as rings 34 and 42 are coaxial with axis 11.

From the foregoing, confined plasma region 8 has a top boundary determined by (1) the bottom face 36a of electrode 36, (2) the bottom face of insulator ring 38 and (3) the bottom face of electrode ring 42, and a bottom boundary determined (1) by the top face of workpiece 18 (when the workpiece is in place), (2) the top face of insulator ring 28 and (3) the top face of electrode ring 34. Motor 43 controls the spacing between the top and bottom boundaries of region 8 by moving the bottom face of top electrode assembly 14 up-and-down relative to the top face of bottom electrode assembly 13. Motor 43 responds to a signal from controller 24 to set the spacing between the faces of electrode assemblies 13 and 14 at an experimentally determined optimum value for the particular frequencies that excite the plasma processing of workpiece 18.

The sides of confined plasma region 8 are bounded by spaced, vertically stacked louvers 44, made of a material that does not contaminate the chemistry of the plasma in region 8. The louvers 44 are made of a material that is either electrically insulating (preferably a dielectric, such as quartz) or somewhat electrically conductive (e.g. silicon carbide) so that the louvers are electrically powered, or float electrically or are electrically grounded. Louvers 44 are such that no substantial amount of plasma flows through the slots between louvers 44. However, un-ionized gas in region 8 escapes through the slots between louvers 44 to region 46 in chamber 10 between wall 12 and ring 32 and is pumped from the interior of chamber 10 by pump 9 through suitable openings in base 19.

Louvers 44 are fixedly spaced from each other in the vertical direction by a suitable spacing arrangement (not shown) and are driven up and down relative to each other and to bottom assembly 13 by motor 47 to control the pressure in confined plasma region 8. The pressure in region 8 is controlled by a pressure set point that set point source 25 supplies to controller 24 and an output signal of pressure gauge 48 in region 8. Controller 24 responds to the pressure set point and the output signal of pressure gauge 48 to control motor 47, and thereby vary the spacing between the bottom face of the lowest louver 44 and the top face of electrode assembly 13. Consequently, the pressure in region 8 is maintained at the pressure set point. Louvers 44 are arranged so that the louvers do not move in response to activation of motor 43, so that the pressure in confined plasma region 8 is controlled independently of the spacing between electrode assemblies 13 and 14.

Several RF sources supply several different frequencies to region 8 via electrode 14. In particular, RF sources $50.1 \ldots 50.i \ldots 50.N$, that can be either of fixed or variable frequency, derive plasma excitation power that is supplied to matching networks $52.1 \ldots 52.i \ldots 52.N$, respectively, where N is an integer greater than 2 and i is sequentially each integer from 1 to N, such that i increases monotonically from 1 to N. (In the ensuing description, reference is sometimes made to sources $50.2$ and $50.(N-1)$ and circuitry associated with them. It is to be understood that source $50.2$ has the next highest frequency to source $50.1$ and source $50.(N-1)$ has the next lowest frequency to source $50.N$ even though the drawings do not include such sources and related circuitry.)

Combiner circuit 53 combines output power matching networks 52.1 ... 52.N and supplies the combined power to electrode 14 via lead 58.

k RF sources 50.$p$ ... 50.N are respectively connected to k matching networks 55.$p$ ... 55.N, where k is less than N, and p is an integer including one; if p is an integer greater than one, p increases monotonically from its minimum value to N. Matching networks 55.$p$ ... 55.N supply power to combiner circuit 57 that supplies output power from networks 55.$p$ ... 55.N to electrode 36 via lead 60. (In many cases, only source 50.N, having the highest frequency, supplies power to electrode 36; in such a case combiner circuit 57 is excluded.)

Typically, power from a single source is not supplied to both electrodes 14 and 36. To supply power on a mutually exclusive basis from sources 50.P ... 50.N to electrodes 14 and 36, switch matrix 59 is connected between sources 50.$p$ ... 50.N and matching networks 52.$p$ ... 50.N and matching networks 55.$p$ ... 55.N. Switch matrix 59 includes two position co-axial switches 59.$p$ ... 59.N, respectively associated with sources 50.$p$ ... 50.N, matching networks 52.$p$ ... 52.N and matching networks 55.$p$ ... 55.N. In a first position, co-axial switch 59.$q$ of matrix 59 supplies power from source 50.$q$ to matching network 52.$q$; in a second position, co-axial switch 59.$q$ supplies power from source 50.$q$ to matching network 55.$q$, wherein q is any one of p ... N.

Each of matching networks 52.1 ... 52.$i$ ... 52.N and 55.$p$ ... 55.N includes at least one variable reactance. If the RF sources have fixed frequency, the matching networks include two variable reactances. If the RF sources have a variable frequency, each of the matching networks has a single variable reactance.

Controller 24 controls the values of the variable reactances of matching networks 52.1 ... 52.N and matching networks 55.$p$ ... 55.N, as well as the output power of each of sources 50.1 ... 50.N. For the variable frequency embodiment, (1) each of sources 50.1 ... 50.N has a built in nominal center frequency and circuitry for detecting the degree of mismatch between the output impedance of the particular source and circuitry for controlling the frequency of the particular source to achieve matching and (2) controller 24 sets the values of the variable reactances of matching networks 52.1 ... 52.N, and networks 55.$p$ ... 55.N, in an open loop manner, based on receipes for processing workpiece 18.

For the fixed frequency embodiment, each of the matching networks 52.1 ... 52.N and networks 55.$p$ ... 55.N is connected to sensor circuitry (not shown in FIG. 1) for detecting the RF voltage, current and the phase angle between them, as reflected back to the source associated with the particular matching network, and at the frequency of the particular source. Controller 24 responds to the detected voltage, current and phase angle to control a variable shunt and series capacitors of each matching network in a manner well known to those of ordinary skill in the art, so that the impedance as seen by each of the RF sources, at the output terminals thereof, is substantially equal to the output impedance of each of the sources, at the frequency of the source.

Under matched conditions, the impedances of matching networks 52.1 ... 52.$i$ ... 52.N are such that the matching networks are tuned to the frequencies of sources 50.1 ... 50.$i$ ... 50.N, respectively, while matching networks 55.$p$ ... 55.N are tuned to the frequencies of sources 50.$p$ ... 50.N, respectively. The matching networks are also arranged so they introduce substantial attenuation for the power of the RF sources that do not directly drive the particular matching network. Each of matching networks 52.1 ... 52.$i$ ... 52.N and 55.$p$ ... 55.N introduces a power attenuation of at least 26 DB for the frequencies of the RF sources, except the frequency of the particular RF source that directly drives the matching network. It has been found that by introducing a power attenuation of at least 26 DB for the frequencies that do not directly drive a particular matching network, the RF source that drives a particular matching network is not adversely affected by power from the other sources, as coupled back to the output terminals of the particular RF source. For example, because matching network 52.1 introduces a power attenuation of at least 26 DB on the output power of each of RF sources 50.2 ... 50.$i$ ... 50.N, the power from RF sources 50.2 ... 50.N does not adversely affect the operation of RF source 50.1.

When switch matrix 59 is activated so that output power of matching networks 52.$r$ ... 52.N (where r is any integer from p to N) is coupled to electrode 36, power at the frequencies of sources 50.1 ... 50.($r$−1) that is supplied to electrode 16 and is coupled by the plasma to electrode 36 is prevented from being coupled back from electrode 36 to matching networks 50.1 ... 50.($r$−1) by connecting lowpass filter 66 to ground by closing switch 68. Filter 66 has a cut-off frequency between the frequencies of sources 50.($r$−1) and 50.$r$ so power from sources 50.1 ... 50.($r$−1) is coupled to ground by filter 66 and is therefore decoupled from the output terminals of matching networks 52.1 ... 52.(N−1), while power from sources 50.$r$ ... 50.N is coupled to electrode 36 via matching networks 52.$r$ ... 52.N, respectively. Conversely, switch 68 is opened in response to switch 55.N coupling power from source 50.N to electrode 16 via matching network 52.N. Controller 24 varies the cut-off frequency of filter 66 as a function of the sources that are coupled to electrodes 16 and 36. Hence, if switch matrix 59 is activated so power from sources 50.1 ... 50.$s$ is coupled to electrode 16 and power from sources 50.($s$+1) ... 50.N is coupled to electrode 36, controller 24 causes the cut-off frequency of filter 66 to be between the frequencies of sources 50.$s$ and 50.($s$+1).

Control over the electric fields between the electrodes of bottom assembly 13 and top assembly 14 and thereby over the plasma incident on workpiece 18 is provided, inter alia, by detecting the DC bias voltages of electrodes 16 and 36 with DC bias detectors 70 and 71. Detectors 70 and 71 are respectively connected in a DC circuit to electrodes 16 and 36 and respectively detect the DC bias voltages that are induced on electrodes 16 and 36 in response to the RF electric fields coupled by electrode assemblies 13 and 14 to the plasma in region 8.

Detectors 70 and 71 respectively supply signals indicative of the DC bias voltages of electrodes 16 and 36 to controller 24. Controller 24 responds to the signals that DC bias detectors 70 and 71 derive to control variable impedances of grounding circuit 72 and 73, respectively. Each of grounding circuits 72 and 73 includes a separate series resonant circuit having a resonant frequency nominally equal substantially to the frequency of one of the RF sources driving the electrode opposite to the electrode with which the grounding circuit is connected; e.g. if source 50.N drives electrode 36, the nominal resonant frequency of ground network 70, connected to electrode 16, equals the frequency of source 50.N. Controller 24 responds to (1) the indications of DC bias voltages that detectors 70 and 71 derive and (2) set points for the DC bias voltages to control a variable reactance (either an inductance or capacitor) of the series resonant circuit in each of grounding circuits 72 and 73. Thereby, the intensity and shape of electric field lines between the electrodes of assemblies 13 and 14 and the characteristics of the plasma incident on workpiece 18 are controlled. In particular, the electric field lines between electrodes 16 and 36, and between electrodes 16 and 42, and between electrodes 16 and 34 are controlled in response to the DC bias voltages that detectors 70 and 71 sense and the DC bias voltage set points for these DC bias voltages.

To assist in providing the desired degree of attenuation for the frequencies that are not derived from a particular RF source, the output terminals of RF sources 50.2 . . . 50.N are respectively connected to shunt inductors 80.2 . . . 80.N. Inductors 80.2 . . . 80.N function as lowpass filters, so that each of inductors 80.2 . . . 80.N shunts power from the lowest frequency RF source 50.1 to ground. Hence, any power from source 50.1 that is coupled through matching networks 52.2 . . . 52.N is prevented from affecting RF sources 50.2 . . . 50.N, respectively. Similarly, inductors 80.3 . . . 80.N couple power from RF sources 50.1 and 50.2 to ground and prevent the output terminals of RF sources 50.3 . . . 50.N from having power from sources 50.1 and 50.2 being coupled to them.

In a typical vacuum plasma processing chamber, there is a significant amount of distributed capacitance between electrode 16 of bottom assembly 13 and ground. The distributed capacitance between electrode 16 and ground has been found to have an adverse effect on matching the output impedances of sources 50.1 . . . 50.$t$ having the lowest frequencies. Series resonant circuits 82.1 . . . 82.$t$, connected in shunt between ground and the outputs of matching networks 52.1 . . . 52.$t$, assist in achieving matching of the output terminals of sources 50.1 . . . 50.$t$ to the impedance reflected back to the sources. Series resonant circuits 82.1 . . . 82.$t$ respectively include fixed inductors 84.1 . . . 84.$t$ and fixed capacitors 86.1 . . . 86.$t$. Circuit 82.$u$ has a resonant frequency between the frequencies of RF sources 50.$u$ and 50.($u$+1). In one example, RF sources 50.1 and 50.2 have frequencies of 2.0 MHz and 27 MHz. To achieve the proper impedance match without adversely affecting the output powers of matching networks 52.1 and 52.2, inductor 84.1 and capacitor 86.1 have values so that they are resonant at a frequency of approximately 5.0 MHz in the foregoing example. The quality factor (Q) of inductors 84.1 . . . 84.$u$ is sufficiently high that shunt resonant circuits 82.1 . . . 82.$u$ does not cause any substantial attenuation of the power that matching networks 52.1 . . . 52.$t$ respectively supply to electrode 16.

When switch matrix 59 is activated so that source 50.N supplies power to electrode 36 via matching network 52.N, power at the frequencies of sources 50.1 . . . 50.(N−1) that is incident on electrode 36 is prevented from being coupled back to combiner circuit 56 and matching networks 50.1 . . . 50.N by connecting lowpass filter 66 to ground by closing switch 68. Filter 66, having a cut-off frequency between the frequencies of sources 50.(N−1) and 50.N, is decoupled from circuit 56, while power from source 50.N is coupled from circuit 56 to electrode 36. Switch 68 is ganged with switch 59.N, so that switch 68 is open circuited in response to switch 59.N coupling power from source 50.N to matching network 52.N. Conversely, switch 68 is closed in response to switch 59.N coupling power from source 50.N to matching network 55.N.

Figure 2:
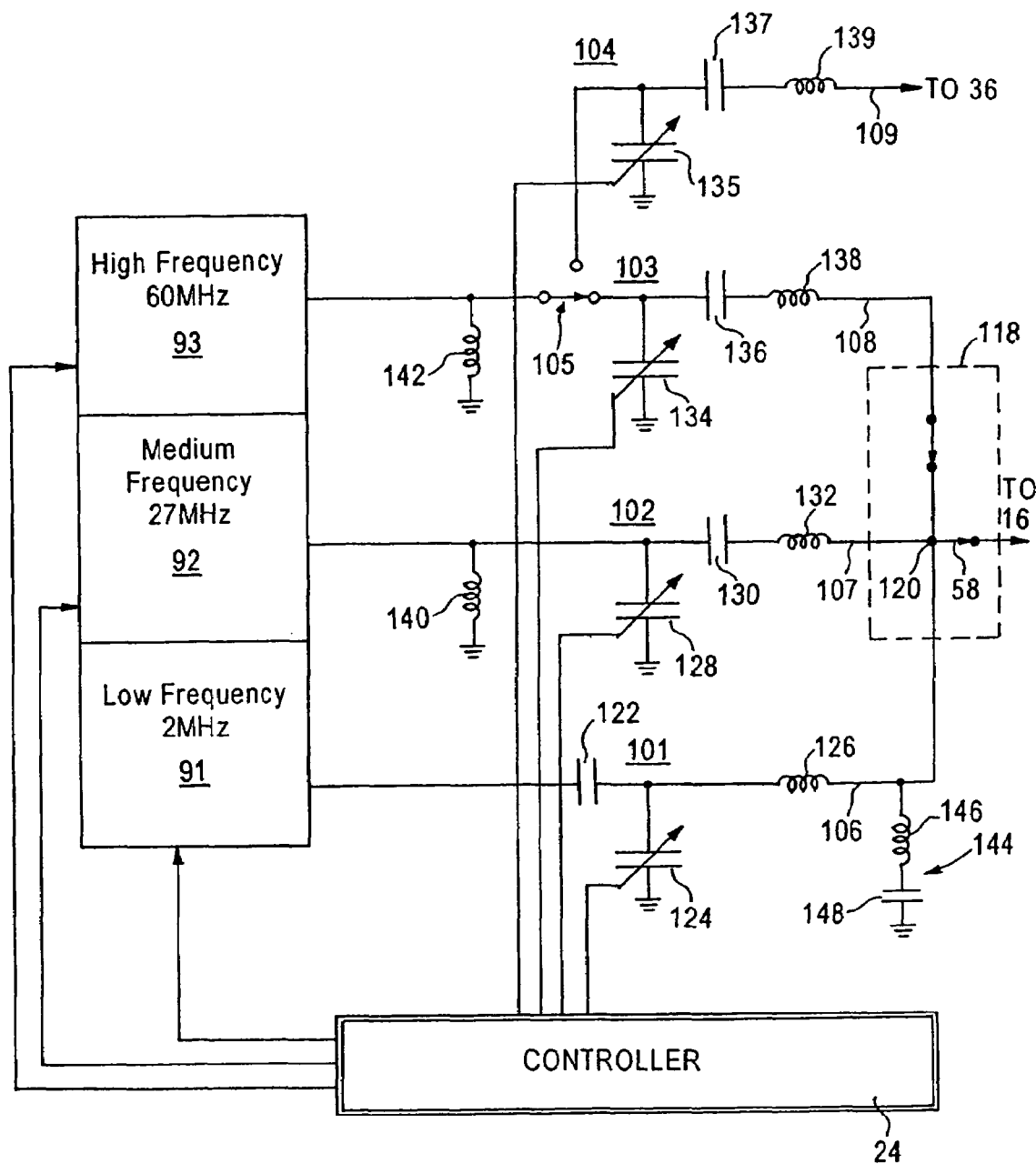
FIG. 2 is a circuit diagram of a first preferred embodiment of a portion of the processor illustrated in FIG. 1, wherein the processor includes three variable frequency RF sources and three matching networks.

Reference is now made to FIG. 2 of the drawing, a partial block and partial electrical schematic diagram of a specific circuit for supplying power to electrode 16 or to electrodes 16 and 36. In the circuit of FIG. 2, N=3 and there are three variable frequency RF sources 91, 92 and 93, respectively having center frequencies of 2 MHz, 27 MHz and 60 MHz. Sources 91, 92 and 93 include circuitry for varying the frequencies thereof from the center frequencies thereof by about ±5%. Sources 91, 92 and 93 control the frequency of the sources by sensing the impedance mismatch between the output impedances of the sources and the impedances the sources drive. Output power of sources 91 and 92 is respectively applied to matching networks 101 and 102 by way of a direct connection. Output power of source 93 is selectively supplied to matching network 103 or 104 by co-axial switch 105. Combiner circuit 118 combines power at the output terminals of matching networks 101, 102 and 103 and supplies the combined power to electrode 16 via lead 58 so that electrode 16 is driven by power sources 91, 92 and 93 in response to controller 24 activating switch 105 to supply power from source 93 to matching network 103. Under these conditions sources 91, 92 and 93 and matching networks 101, 102 and 103 do not directly supply power to electrode 36. In response to controller 24 activating switch 105 so power from source 93 is supplied to matching network 104 to the exclusion of network 103, electrode 36 is driven by power from source 93 via network 104, while sources 91 and 92 respectively drive electrode 16 via networks 101 and 102 and combiner 118.

Matching networks 101, 102, 103 and 104 respectively supply power to leads 106, 107, 108 and 109 at the frequencies of sources 91, 92, 93 and 93. Based on the foregoing, the power on each of leads 106, 107 and 108, at the frequencies of sources of 91, 92 and 93, is supplied only to electrode 16 under a first scenario; alternatively, under a second scenario the power on leads 106 and 107 is supplied to electrode 16 while the power on lead 109 is supplied to electrode 36.

Controller 24 responds to stored signals in a memory (not shown). The stored signals depend on desired properties of workpiece 18 to control variable shunt capacitors of matching networks 101, 102 and 103, in an open loop manner.

To achieve the 26 DB power attenuation of energy that is not at the same frequency as the energy driving a particular matching network, each of matching networks 101, 102, 103 and 104 includes a variable shunt capacitor, a fixed series capacitor and a fixed inductor. Matching network 101 includes variable shunt capacitor 124 that is connected between fixed series capacitor 122 and fixed series inductor 126. Matching network 102 includes fixed series capacitor 130 that is connected between shunt capacitor 128 and fixed series inductor 132. Matching network 103 includes variable shunt capacitor 134, fixed series capacitor 136 and a fixed known amount of series inductance, in the form of distributed inductance, represented in FIG. 2 by series inductor 138. Matching network 104 includes variable shunt capacitor 135, fixed series capacitor 137 and a fixed known amount of series inductance, in the form of distributed inductance, represented in FIG. 2 by series inductor 139.

Controller 24 responds to the stored recipe determined signals to control the values of variable, shunt capacitors 124, 128 and 134. It is to be understood that DC motors (not shown) are typically employed to vary the values of capacitors 124, 128, 134 and 135 or that each of the variable capacitors can have many fixed values that are connected in circuit by switches. Controller 24 varies the values of capacitors 124, 128, 134 and 135 to assist in achieving impedance matching of sources 91, 92, 93 and 93, respectively.

Typical values of capacitors 122, 130, 136 and 137 are 600 picofarads, 110 picofarads, and 40 picofarads and 100 picofarads, respectively. A typical value of fixed inductor 126 is in the range of 15–20 microhenries, while a typical value of inductor 132 is in the range of 50–100 nanohenries, and a typical distributed inductance of each of matching networks 103 and 104, as represented by inductors 138 and 139, is less than 50 nanohenries. It is to be understood that inductors 126 and 132 can be variable inductors, if the required matching effect cannot otherwise be achieved. Typical values of variable, shunt capacitor 124 are in the range of 300–600 picofarads; typical values of variable, shunt capacitor 128 are in the range of 50–1000 picofarads; typical values of variable, shunt capacitor 134 are in the range of 20–330 picofarads; and typical values of variable shunt capacitor 135 are in the range of 20–300 picofarads. The foregoing values of the components of matching networks 101, 102, 103 and 104 enable the matching networks to provide the desired power attenuation to prevent unwanted frequencies from being coupled back to the source that drives the particular matching network. In addition, the foregoing values enable each of matching networks 101, 102, 103 and 104 to be approximately tuned (i.e. resonant) to the frequencies of sources 91, 92 and 93, respectively. Hence, matching networks 101, 102, 103 and 104 respectively have low impedances for the frequencies of sources 91, 92, 93 and 93. However, matching network 101 inserts a power attenuation of at least 26 DB for the frequencies of sources 92 and 93, matching network 102 inserts a power attenuation of at least 26 DB for the frequencies of sources 91 and 93, and each of matching networks 103 and 104 inserts a power attenuation of at least 26 DB for the frequencies of sources 91 and 92.

To prevent the relatively high power of low frequency source 91 from being coupled back to the output terminals of sources 92 and 93, shunt inductors 140 and 142 are respectively connected across the output terminals of sources 92 and 93. Inductors 140 and 142 have high impedances to the frequencies of sources 92 and 93, but have low impedances to the frequency of source 91. Hence, any power from source 91 that might be coupled through matching networks 102, 103 and 104 toward sources 92, 93 and 93, respectively, is prevented from reaching these sources by shunt inductors 140 and 142. Because shunt inductors 140 and 142 have high impedances at the frequencies of sources 92 and 93, virtually no power from sources 92 and 93 is coupled to ground through inductors 140 and 142, respectively.

Bottom electrode 16 has a substantial parasitic, i.e., distributed, capacitance to ground. To assist in providing an impedance match between source 91 and the impedance of electrode 16, series resonant circuit 144 is connected between lead 104 and ground. Circuit 144 includes series connected inductor 146 and capacitor 148. Circuit 144 has a resonant frequency of approximately 5 MHz, i.e., approximately one octave above the frequency of source 91 and approximately two and a half octaves below the frequency of source 92. Inductor 146 has a relatively high Q so that series resonant circuit 144 has a relatively narrow bandwidth and does not shunt significant power from source 91 or source 92 to ground.

The overall effect of the circuit of FIG. 2 is to provide the desired low impedance for the sources 91, 92 and 93 driving electrode 16 or electrodes 16 and 36, while introducing sufficient attenuation to prevent damage to sources 91, 92 and 93 and attain the desired impedance match.

Figure 3:
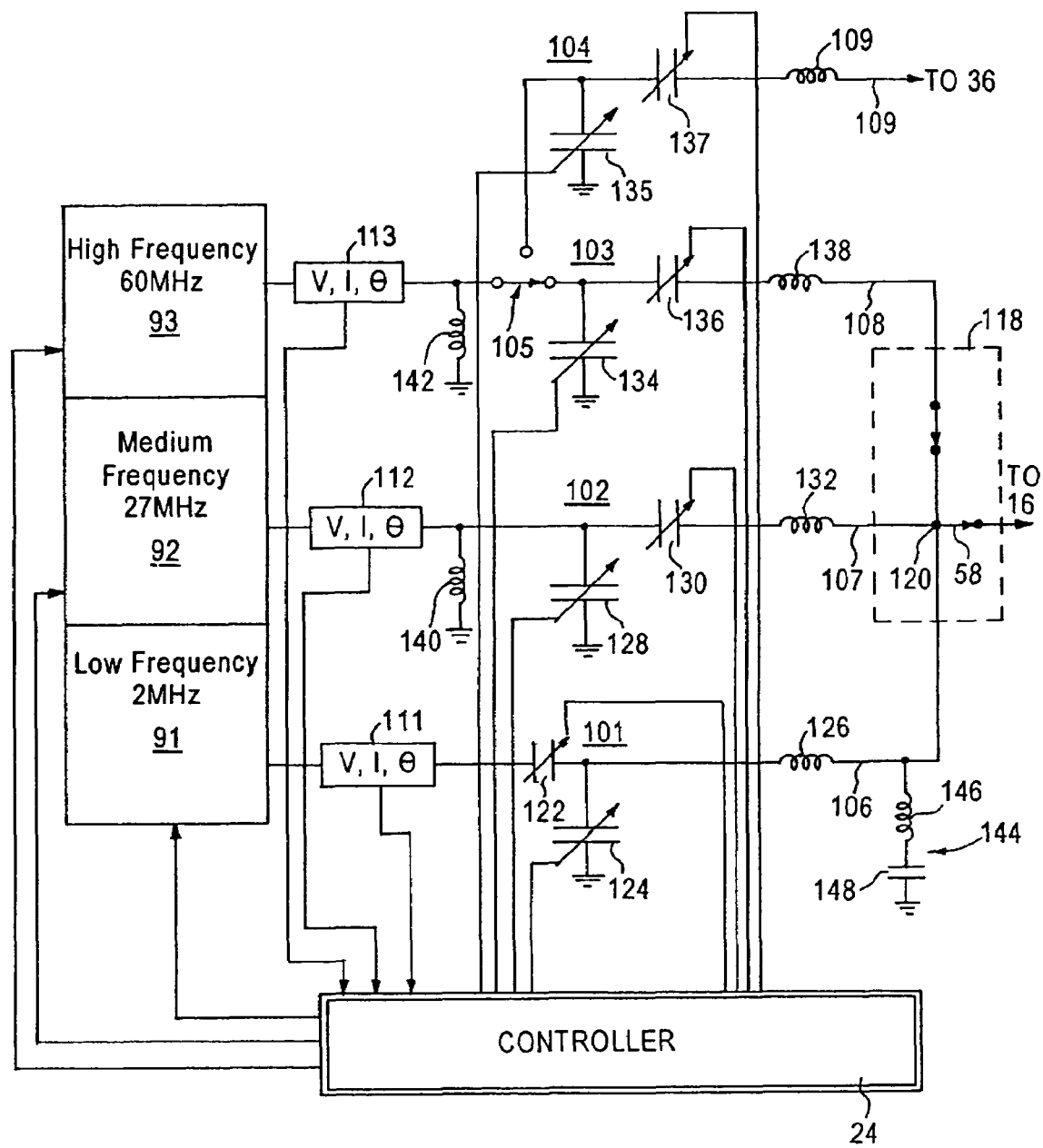
FIG. 3 is a circuit diagram of a second preferred embodiment of a portion of the processor illustrated in FIG. 1, wherein the processor includes three fixed frequency RF sources and three matching networks, each including two variable capacitors.

Reference is now made to FIG. 3 of the drawing, a block diagram of circuitry for driving electrodes 16 and 36, wherein sources 91, 92 and 93 have fixed frequencies of 2 MHz, 27 MHz and 60 MHz, respectively, and impedance matching is achieved by changing fixed capacitors 122, 130 and 136 to variable capacitors. The circuit of FIG. 3 includes sensors 111, 112 and 113, connected directly to the output terminals of sources 91, 92 and 93, respectively. Sensors 111, 112 and 113 detect the magnitude of the voltage and current reflected back to sources 91, 92 and 93 (at the frequencies of the particular source directly driving the particular sensor), respectively, and the phase angle between the reflected voltage and currents. Controller 24 responds to the signals from detectors 111, 112 and 113 to control the values of variable, series capacitors 122, 130, 136 and 137 to achieve the desired impedance match. To achieve the desired impedance match, capacitor 122 typically has values in the range of 50–1,000 picofarads, capacitor 130 typically has values in the range of 50–1,000 picofarads, and each of capacitors 136 and 137 typically has values in the range of 20–330 picofarads. Motors (not shown) respond to signals from controller 24 to vary the values of capacitors 122, 130, 136 and 137. The stated range of values for capacitors 122, 130, 136 and 137 enables impedance matching to be achieved. In addition, matching networks 101, 102, 103 and 104 respectively have resonant frequencies approximately equal to the frequencies of sources 91, 92, 93 and 93. Matching networks 101, 102, 103 and 104 also provide the desired attenuation for frequencies that do not directly drive the matching networks.

Figure 4:
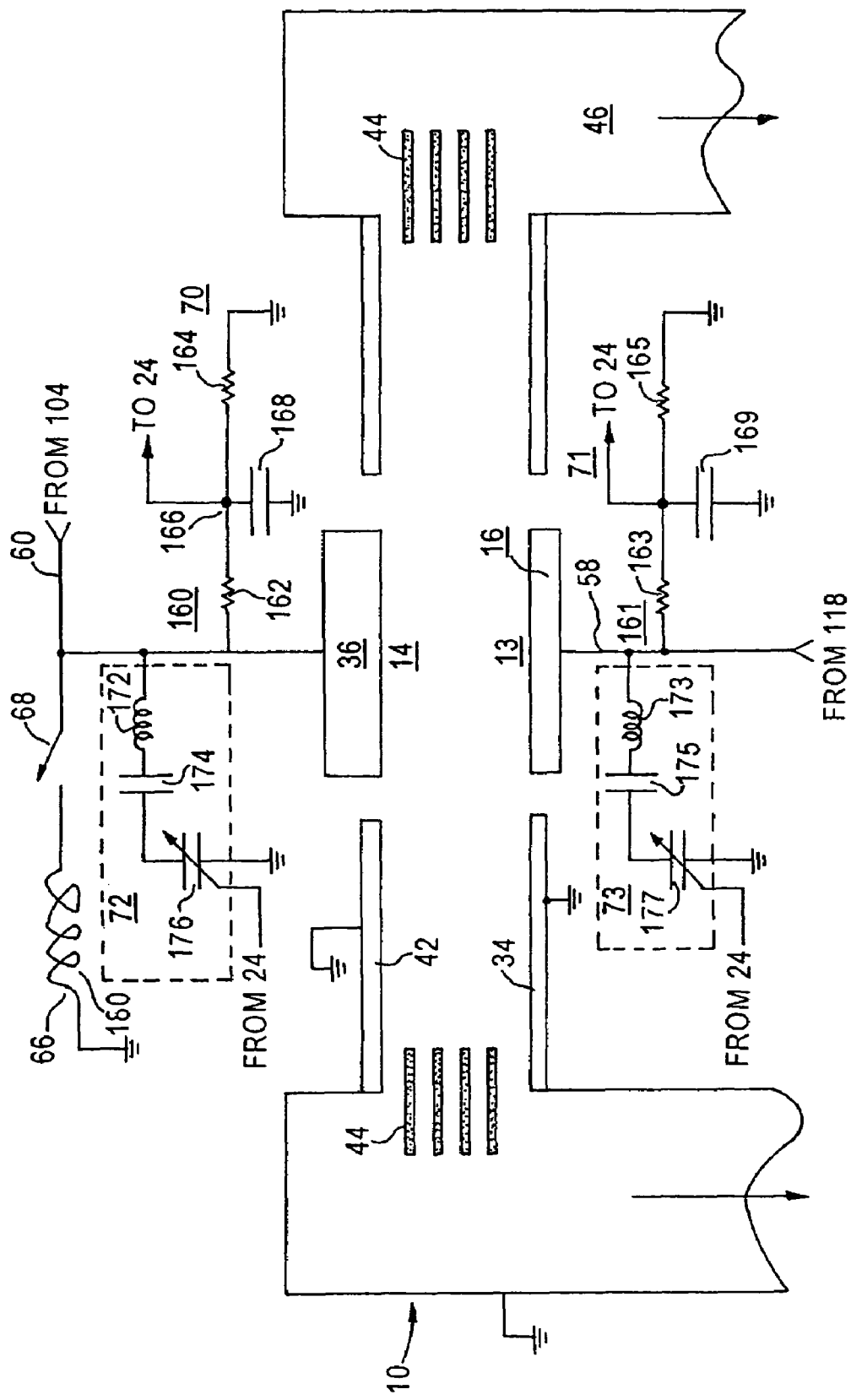
FIG. 4 is a circuit diagram of a portion of the vacuum plasma processor of FIG. 1.

Reference is now made to FIG. 4 of the drawing, a schematic diagram of circuitry for controlling the electric field lines between electrodes 16, 34, 36 and 42 in vacuum plasma processing chamber 10, including louvers 44. The circuitry of FIG. 4 is driven by the sources of FIG. 2 or FIG. 3. As schematically illustrated in FIG. 4, electrodes 16 and 36 are center electrodes, with electrode 16 arranged to carry the workpiece. Electrodes 16 and 36 are coaxial with each other and centrally located in chamber 10, while electrode 34 is formed as a ring, surrounding and spaced from the periphery of electrode 16. The upper faces of electrodes 16 and 34 are co-planar. Electrode 36 has a diameter approximately one third greater than that of electrode 16, and is surrounded by and spaced from ring electrode 42. Electrodes 34 and 42 are grounded. Because of substantial parasitic capacitance associated with electrode 36, it is difficult to ground electrode 36, particularly for the frequency of source 92. Because of substantial parasitic capacitance associated with electrode 16, it is difficult to ground electrode 16 for the frequency of source 93. It is frequently desired to ground electrode 16 for the frequency of source 93 when source 93 drives electrode 36 directly as a result of source 93 being connected by switch 105 to drive matching network 104.

Grounding circuit 72 responds to the DC bias voltage of electrode 16, as coupled by DC bias detector 70 to controller 24. Grounding circuit 72 includes a variable impedance that is controlled by the DC bias voltage of electrode 16 to control the electric fields at 60 MHz between electrodes 16, 34, 36 and 42. In particular, circuit 72 has a series resonant circuit having a variable resonant frequency centered about 60 MHz. The series resonant circuit is connected between electrode 16 and ground.

Grounding circuit 73 responds to the DC bias voltage of electrode 36, as coupled by DC bias detector 71 to controller 24. Grounding circuit 73 includes a variable impedance that is controlled by the DC bias voltage of electrode 16 to control the electric fields at 27 MHz between electrodes 36, 34, 16 and 42. In particular, circuit 73 has a series resonant circuit having a variable resonant frequency centered about 27 MHz. The series resonant circuit is connected between electrode 36 and ground.

DC bias detector 70 includes a resistive voltage divider 160, including resistors 162 and 164, typically having values of 10 megohms and 10 kilohms, respectively. Tap 166 between resistors 162 and 164 is connected to ground by capacitor 168, typically having a value of approximately one microfarad so that the voltage at tap 166 includes no substantial AC components and is an accurate indication of the DC bias voltage developed at electrode 16 in response to the excitation of the confined plasma in region 8. The DC voltage at tap 166 is coupled to controller 24.

Grounding circuit 72 includes shunt circuit 170 connected between electrode 16 and ground. Shunt circuit 170 consists of passive components and includes fixed inductor 172, fixed capacitor 174 and variable capacitor 176, all connected in series with each other. The values of inductor 172 and capacitors 174 and 176 are such that circuit 170 has a relatively fixed impedance for the 2 MHz and 27 MHz frequencies of sources 91 and 92, but a variable impedance for the frequency of 60 MHz frequency of source 93. Typically, capacitor 174 has a value of approximately 100 picofarads, while capacitor 176 has a value in the range of 20–400 picofarads, depending on the DC bias voltage at tap 166 and a set point value for the DC bias voltage. Controller 24 responds to the voltage at tap 166 to vary the value of capacitor 176 to enable the set point value for the DC bias voltage to be achieved. Controller 24 drives a motor (not shown) to vary the value of capacitor 176.

The set point value for the DC bias voltage is determined by the desired relationship for the electric field lines between electrodes 16, 34, 36 and 42. If it is desired for the electric field lines at 60 MHz to be primarily between electrodes 16 and 36, the DC bias set point is such that circuit 170 is a series resonant circuit having a resonant frequency equal to 60 MHz. Thereby, a very low impedance subsists between electrode 16 and ground and a significant percentage of the current at 60 MHz flows from electrode 36 to electrode 16, thence to ground through circuit 170 and strong 60 MHz electric field lines exist between electrodes 36 and 16. Under these conditions, there are relatively weak 60 MHz electric field lines between electrodes 16 and 42 and between electrodes 16 and 34, and somewhat stronger 60 MHz electric field lines between electrodes 36 and 34. If, however, it is desired for the 60 MHz electric field lines between electrodes 36 and 42 to be greater than the electric field lines between electrodes 36 and 16, the set point for the DC bias voltage is at a value causing capacitor 176 to be varied so the impedance of circuit 170 at 60 MHz is relatively high, compared to the impedance of circuit 170 when circuit 170 is resonant to the 60 MHz frequency of source 93. In response to capacitor 176 being driven so the value thereof causes circuit 170 to have a high impedance to the 60 MHz output of source 93, the electric field lines between electrodes 36 and 16 are relatively weak, while the electric field lines between electrode 36 and electrode 34 are relatively strong, as are the electric field lines between electrode 36 and electrode 34.

DC bias detector 71 includes a resistive voltage divider 161, including resistors 163 and 165, typically having values of 10 megohms and 10 kilohms, respectively. Tap 167 between resistors 163 and 165 is connected to ground by capacitor 169, typically having a value of approximately one microfarad so that the voltage at tap 167 includes no substantial AC components and is an accurate indication of the DC bias voltage developed at electrode 36 in response to the excitation of the confined plasma in region 8. The DC voltage at tap 167 is coupled to controller 24.

Grounding circuit 73 includes shunt circuit 171 connected between electrode 36 and ground. Shunt circuit 171 consists of passive components and includes fixed inductor 173, fixed capacitor 175 and variable capacitor 177, all connected in series with each other. The values of inductor 173, and capacitors 175 and 177 are such that circuit 171 has a relatively fixed impedance for the 2 MHz and 60 MHz frequencies of sources 91 and 93, but a variable impedance for the frequency of 27 MHz frequency of source 92. Typically, capacitor 175 has a value of approximately 120 picofarads, while capacitor 177 has a value in the range of 50–1000 picofarads, depending on the DC bias voltage at tap 167 and a set point value for the DC bias voltage. Controller 24 responds to the voltage at tap 167 to vary the value of capacitor 177 to enable the set point value for the DC bias voltage to be achieved. Controller 24 drives a motor (not shown) to vary the value of capacitor 167.

The set point value for the DC bias voltage is determined by the desired relationship for the electric field lines between electrodes 36, 34, 16 and 42. If it is desired for the electric field lines at 27 MHz to be primarily between electrodes 36 and 16, the DC bias set point is such that circuit 171 is a series resonant circuit having a resonant frequency equal to 27 MHz. Thereby, a very low impedance subsists between electrode 36 and ground and a significant percentage of the current at 27 MHz flows from electrode 16 to electrode 36, thence to ground through circuit 171 and strong 27 MHz electric field lines exist between electrodes 16 and 36. Under these conditions, there are relatively weak 27 MHz electric field lines between electrodes 36 and 42, and between electrodes 36 and 34, and somewhat stronger 27 MHz electric field lines between electrodes 16 and 34. If, however, it is desired for the 27 MHz electric field lines between electrodes 16 and 42 to be greater than the electric field lines between electrodes 16 and 36, the set point for the DC bias voltage is at a value causing capacitor 177 to be varied so the impedance of circuit 171 at 27 MHz is relatively high, compared to the impedance of circuit 171 when circuit 171 is resonant to the 27 MHz frequency of source 92. In response to capacitor 177 being driven so the value thereof causes circuit 171 to have a high impedance to the 27 MHz output of source 92, the electric field lines between electrodes 16 and 36 are relatively weak, while the electric field lines between electrode 16 and electrode 34 are relatively strong, as are the electric field lines between electrode 16 and electrode 34.

To further assist in decoupling the 2 MHz and 27 MHz energy that is incident on electrode 36 while switch and combiner circuit 118 is activated so the 60 MHz output of source 92 is coupled to electrode 36, filter 66 is connected by relay 68 in shunt with electrode 36. As illustrated in FIG. 4, filter 66 comprises inductor 180 that is connected to electrode 36 that controller 24 activates simultaneously with activating the switch of circuit 118 so the output of high frequency source 93 is coupled to electrode 36 via lead 60. Inductor 180 has a sufficiently high value and large impedance at the 60 MHz frequency of source 93 to prevent the 60 MHz energy from being coupled to ground. However, the value of inductor 180 is such as to present a relatively low impedance to the 2 MHz and 27 MHz frequencies of sources 91 and 92, to prevent coupling of the 2 MHz and 27 MHz energy incident on electrode 36 from back to circuit 118.

While there have been described and illustrated a specific embodiment of the invention, it will be clear that variations in the details of the embodiment specifically illustrated and described may be made without departing from the true spirit and scope of the invention as defined in the appended claims.

The invention claimed is:

1. A vacuum plasma processor for processing a workpiece comprising:
    a vacuum plasma processing chamber including an electrode, the chamber being associated with a reactance, the electrode and reactance being arranged for coupling plasma excitation fields to gas in the chamber, the chamber being arranged for carrying a workpiece,
    N sources of radio frequency electric power, where N is an integer having a value of at least three, each of the sources being arranged for deriving a different radio frequency, and
    circuitry for supplying electric power at the N frequencies from the N sources of radio frequency electric power to a region in the chamber via the electrode and reactance,
    the N frequencies, the power at each of the N frequencies, the electrode, the reactance, and the circuitry being arranged for (a) causing the plasma to be excited to each of the N frequencies and (b) preventing substantial coupling of power to each of said N sources at a frequency other than the frequency associated with the radio frequency of the particular source, the N frequencies and the circuitry being arranged so that at least 26 DB of power attenuation is inserted by the circuitry for preventing substantial coupling of power to each of said N sources at a frequency other than the frequency associated with the radio frequency of the particular source.

2. The vacuum plasma processor of claim 1 wherein the circuitry is arranged to supply at least three of the N frequencies to the electrode.

3. The vacuum plasma processor of claim 2 wherein the circuitry includes N impedance matching networks, each impedance matching network being associated with one of the sources and being arranged for (a) coupling plasma excitation power at the frequency of the source with which is associated to the electrode and (b) attenuating power at the frequencies of the other sources sufficiently to prevent substantial coupling of power at the frequencies of the other sources to the source associated with the matching network.

4. The vacuum plasma processor of claim 3 wherein N=3 and the frequencies are F1, F2, and F3, where F1 is the lowest frequency, F3 is the highest frequency, and F2 is between F1 and F3, the first, second and third frequencies being such that there is at least a one octave difference between adjacent pairs of F1, F2, and F3.

5. The vacuum plasma processor of claim 4 wherein F2 is at least one decade higher than F1.

6. The vacuum plasma processor of claim 1 wherein the circuitry includes N impedance matching networks, each impedance matching network being associated with one of the sources and being arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network.

7. The vacuum plasma processor of claim 6 wherein each of the impedance matching networks includes a capacitance arrangement and an inductance tuned substantially to the frequency of the source associated with a particular one of the matching networks.

8. The vacuum plasma processor of claim 7 wherein the sources of radio frequency electric power have a variable frequency within a range such that there is at least a one octave difference between the frequencies of adjacent pairs of frequencies, and further including a controller for the frequencies of the sources, the controller including a sensor for determining the degree of impedance matching, at the frequency of the source, between the output impedance of each of the sources and the impedance driven by the source, at the frequency of the source, the controller being arranged for controlling the frequency of the sources in response to the determined degree of impedance matching at each of the frequencies.

9. The vacuum plasma processor of claim 8 wherein each of the impedance matching networks includes a fixed series capacitor, a variable shunt capacitor and an inductance, the controller being arranged for controlling the value of the variable shunt capacitor in response to the determined degree of impedance matching at each of the frequencies.

10. The vacuum plasma processor of claim 9 wherein N=3 and the frequencies are approximately 2 MHz, 27 MHz and 60 MHz, the impedance matching networks associated with the 2 MHz and 27 MHz sources including inductors connected in series with the respective sources and the electrode, and the impedance matching network associated with the 60 MHz source comprises a distributed inductance, the inductor of the impedance matching network associated with the 2 MHz source having an inductance substantially greater than the inductor of the impedance matching network, associated with the 27 MHz source, the inductor of the impedance matching network associated with the 27 MHz source having an inductance substantially greater than the distributed inductance of the impedance matching network associated with the 60 MHz source.

11. The vacuum plasma processor of claim 10 wherein the circuitry for supplying electric power includes first and second filters respectively associated with the 27 Mhz and 60 MHz sources, the first and second filters being respectively arranged for enabling electric power from the 27 MHz source and the 60 MHz source to be coupled without substantial attenuation to the electrode while substantially attenuating power from the 2 MHz source and preventing power from the 2 MHz source from being coupled to the 27 MHz source and the 60 MHz source.

12. The vacuum plasma processor of claim 7 wherein the sources of radio frequency electric power have fixed frequencies and each of the impedance matching networks includes a variable series capacitor, a variable shunt capacitor and an inductance, and further including a controller for the variable capacitors, the controller including a sensor for determining the degree of impedance matching, at the frequency of the source, between the output impedance of each of the sources and the impedance driven by the source, at the frequency of the source, the controller being arranged for controlling the variable capacitors in response to the determined degree of impedance matching at each of the frequencies.

13. The vacuum plasma processor of claim 12 wherein N=3 and the frequencies are approximately 2 MHz, 27 MHz and 60 MHz, the impedance matching networks associated with the 2 MHz and 27 MHz sources including inductors connected in series wit the respective sources and the electrode, and the impedance matching network associated with the 60 MHz source including a distributed inductance, the inductor of the impedance matching network associated with the 2 MHz source having an inductance substantially greater than the inductor of the impedance matching network associated with the 27 MHz source, the inductor of the impedance matching network associated with the 27 MHz source having an inductance substantially greater than the distributed inductance of the impedance matching network associated with the 60 MHz source.

14. The vacuum plasma processor of claim 13 wherein the circuitry for supplying electric power includes first and second filters respectively associated with the 27 MHz and 60 MHz sources, the first and second filters being respectively arranged for enabling electric power from the 27 MHz source and the 60 MHz source to be coupled without substantial attenuation to the electrode while substantially attenuating power from the 2 MHz source and preventing power from the 2 MHz source from being coupled to the 27 MHz source and the 60 MHz source.

15. The vacuum plasma processor of claim 7 wherein N=3 and the frequencies are approximately 2 MHz, 27 MHz and 60 MHz, the impedance matching networks associated with the 2 MHz and 27 MHz sources including inductors connected in series with the respective sources and the electrode, and the impedance matching network associated with the 60 MHz source including a distributed inductance, the inductor of the impedance matching network associated with the 2 MHz source having an inductance substantially greater than the inductor of the impedance matching network associated with the 27 MHz source, the inductor of the impedance matching network associated with the 27 MHz source having an inductance substantially greater than the distributed inductance of the impedance matching network associated with the 60 MHz source.

16. The vacuum plasma processor of claim 15 wherein the circuitry for supplying electric power includes first and second filters respectively associated with the 27 MHz and 60 MHz sources, the first and second filters being respectively arranged for enabling electric power from the 27 MHz source and the 60 MHz source to be coupled without substantial attenuation to the electrode while substantially attenuating power from the 2 MHz source and preventing substantial coupling of power from the 2 MHz source to the 27 MHz source and the 60 MHz source.

17. The vacuum plasma processor of claim 16 wherein the circuitry for supplying electric power includes a series resonant circuit connected in shunt between the impedance matching network associated with the 2 MHz source and the electrode, the series resonant circuit having a resonant frequency between 2 MHz and 27 MHz so as to have no substantial effect on the power coupled to the electrode at 27 MHz and 60 MHz while assisting in providing impedance matching of the 2 MHz source to parasitic impedance associated with the electrode.

18. The vacuum plasma processor of claim 16 wherein the circuitry for supplying electric power includes a series resonant circuit connected in shunt between the impedance matching network associated with the 2 MHz source and the electrode, the series resonant circuit having a resonant frequency of about 5 MHz.

19. The vacuum plasma processor of claim 7 wherein N=3 such that the first, second and third sources are respectively arranged for deriving first, second and third frequencies, the third frequency being greater than the second frequency and the second frequency being greater than the first frequency, the impedance matching networks associated with the first, second and third sources including first, second and third inductances respectively series coupled with the first, second and third sources and the electrode, the inductance of the impedance matching network associated with the first source having an inductance substantially greater than the inductance of the impedance matching network associated with the second source, the inductance of the impedance matching network associated with the second source having an inductance substantially greater than the inductance of the impedance matching network associated with the third source.

20. The vacuum plasma processor of claim 19 wherein the circuitry for supplying electric power includes first and second filters respectively associated with the second and third sources, the first and second filters being respectively arranged for enabling electric power from the second source and the third source to be coupled without substantial attenuation to the electrode while substantially attenuating power from the first source and preventing power from the first source from being coupled to the second and third sources.

21. The vacuum plasma processor of claim 20 wherein the circuitry for supplying electric power includes a series resonant circuit connected in shunt between the electrode and the impedance matching network associated with the first frequency, the series resonant circuit having a resonant frequency between the first and second frequencies so as to have no substantial effect on the power coupled to the electrode at the second and third frequencies while assisting in providing impedance matching of the first frequency to parasitic impedance associated with the electrode.

22. The vacuum plasma processor of claim 19 wherein the circuitry for supplying electric power includes a series resonant circuit connected in shunt between the impedance matching network associated with the first frequency and the electrode, the series resonant circuit having a resonant frequency between the first and second frequencies so as to have no substantial effect on the power coupled to the electrode at the second and third frequencies while assisting in providing impedance matching of the first frequency to parasitic impedance associated with the electrode.

23. The vacuum plasma processor of claim 1 wherein N=3 such that the first, second and third sources are respectively arranged for deriving first, second and third frequencies, the third frequency being greater than the second frequency and the second frequency being greater than the first frequency, the circuitry for supplying electric power including first and second filters respectively associated with the second and third sources, the first and second filters being respectively arranged for enabling electric power from the second source and the third source to be coupled without substantial attenuation to the electrode while substantially attenuating power from the first source and preventing substantial coupling of power from the first source to the second and third sources.

24. The vacuum plasma processor of claim 23 wherein the circuitry includes first, second and third impedance matching networks respectively associated with the first, second and third sources and being arranged for (a) coupling plasma excitation power at the frequency of the source with which is associated to the electrode and (b) attenuating power at the frequencies of the other sources sufficiently to prevent power at the frequencies of the other sources from being coupled to the source associated with the matching network, the first filter including a first inductor connected in shunt between the second source and the second impedance matching network, the second filter including a second inductor connected in shunt between the third source and the third impedance matching network.

25. The vacuum plasma processor of claim 24 wherein the circuitry for supplying electric power includes a series resonant circuit connected in shunt between the impedance matching network associated with the first frequency source and the electrode, the series resonant circuit having a resonant frequency between the first and second frequencies so as to have no substantial effect on the power coupled to the plasma at the second and third frequencies while assisting in providing impedance matching of the first frequency to parasitic impedance associated with the electrode.

26. The vacuum plasma processor of claim 1 wherein the circuitry includes N impedance matching networks, each impedance matching network being associated with one of the sources and being arranged for (a) coupling plasma excitation power at the frequency of the source with which it is associated to the electrode or the reactance and (b) attenuating power at the frequencies of the other sources sufficiently to prevent substantial coupling of power at the frequencies of the other sources from being coupled to the source associated with the matching network.

27. The vacuum plasma processor of claim 26 wherein the circuitry for supplying electric power includes a series resonant circuit connected in shunt between the impedance matching network associated with the lowest frequency source and the electrode, the series resonant circuit having a resonant frequency between the lowest and the next lowest frequencies so as to have no substantial effect on the power coupled to the plasma at any of the frequencies above the lowest frequency while assisting in providing impedance matching of the lowest frequency to parasitic impedance associated with the electrode.

28. The vacuum plasma processor of claim 27 wherein source i is arranged to derive a radio frequency Fi, where i is sequentially each integer from 1 to N, and each impedance matching network includes a series inductance, the series inductance of the impedance matching network associated with source i being less than the series inductance of each of the impedance matching networks 1 to (i–1).

29. The vacuum plasma processor of claim 26 wherein source i is arranged to derive a radio frequency Fi, where i is sequentially each integer from 1 to N, and each impedance matching network includes a series inductance, the series inductance of the impedance matching network associated with source i being less than the series inductance of each of the impedance matching networks 1 to (i–1).

30. The vacuum plasma processor of claim 1 wherein the reactance comprises a second electrode spaced from the first named electrode, the circuitry including a switching arrangement for selectively supplying power from at least one of the sources to the first named electrode or to the second electrode.

31. A vacuum plasma processor for processing a workpiece comprising:
a vacuum plasma processing chamber including an electrode, the chamber being associated with a reactance, the electrode and reactance being arranged for coupling plasma excitation fields to gas in the chamber, the chamber being arranged for carrying a workpiece,
N sources of radio frequency electric power, where N is an integer having a value of at least three, each of the sources being arranged for deriving a different radio frequency such that source i is arranged to derive a radio frequency Fi, where i is sequentially each Integer from 1 to N, frequency F1 being the lowest frequency, frequency FN being the highest frequency, and the frequencies increasing in order from F1 to FN, and
circuitry for supplying electric power at the N frequencies from the N sources of radio frequency electric power to a region of the chamber via the electrode and reactance, the N frequencies, the power at each of the N frequencies, the electrode, the reactance, and the circuitry being arranged for (a) causing the plasma to be excited to each of the N frequencies and (b) preventing substantial coupling of power to each of said N sources at a frequency other than the frequency associated with the particular source,
the circuitry including N impedance matching networks, each impedance matching network being associated with one of the sources and being arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network, each impedance matching network including a series inductance, the series inductance of the impedance matching network associated with source i being less than the series inductance of each of the impedance matching networks 1 to (i–1).

32. The vacuum plasma processor of claim 31 wherein the circuitry for supplying electric power includes a series resonant circuit connected in shunt between the impedance matching network associated with the source having the frequency F1 and the electrode, the series resonant circuit having a frequency between F1 and F2 so as to have no substantial effect on the power coupled to the plasma at any of the frequencies above F1 while assisting in providing impedance matching of F1 to parasitic impedance associated with the electrode.

33. The vacuum plasma processor of claim 32 wherein each of the impedance matching networks includes a series capacitor and a shunt capacitor.

34. The vacuum plasma processor of claim 33 wherein the circuitry for supplying electric power includes (N–1) filters respectively associated with the sources 2 to N, the (N–1) filters being respectively arranged for enabling electric power from the sources 2 to N to be coupled without substantial attenuation to the electrode or reactance while substantially attenuating power from source land for preventing power from the source 1 from being coupled to sources 2 to N.

35. The vacuum plasma processor of claim 31 wherein the circuitry for supplying electric power includes (N–1) filters respectively associated with the sources 2 to N, the (N–1) filters being respectively arranged for enabling electric power from the sources 2 to N to be coupled without substantial attenuation to the electrode or reactance while substantially attenuating power from source land for preventing power from the source 1 from being coupled to sources 2 to N.

36. The vacuum plasma processor of claim 35 wherein each of the filters includes an inductor connected in shunt between the source associated with the filter and the impedance matching network associated with the source.

37. The vacuum plasma processor of claim 31 wherein the reactance comprises a second electrode spaced from the first named electrode, the circuitry including a switching arrangement for selectively supplying power from at least one of the sources to the first named electrode or to the second electrode.

38. A vacuum plasma processor for processing a workpiece comprising:
a vacuum plasma processing chamber including an electrode, the chamber being associated with a reactance, the electrode and reactance being arranged for coupling plasma excitation fields to gas in the chamber, the chamber being arranged for carrying a workpiece, N sources of radio frequency electric power, where N is an integer having a value of at least three, each of the sources being arranged for deriving a different radio frequency such that source i is arranged to derive a radio frequency Fi, where i is sequentially each integer from 1 to N, frequency F1 being the lowest frequency, frequency FN being the highest frequency, and the frequencies increasing in order from F1 to FN, and circuitry for supplying electric power at the N frequencies from the N sources of radio frequency electric power to a region of the chamber via the electrode and reactance, the N frequencies, the power at each of the N frequencies, the electrode, the reactance, and the circuitry being arranged for (a) causing the plasma to be excited to each of the N frequencies and (b) preventing substantial coupling of power to each of said N sources at a frequency other than the frequency associated with the particular source, the circuitry including N impedance matching networks, each impedance matching network being associated with one of the sources and being arranged for (a) coupling plasma excitation power at the frequency of the source with which it is associated to the electrode and (b) attenuating power at the frequencies of the other sources sufficiently to prevent substantial coupling of power at the frequencies of the other sources to the source associated with the matching network, the circuitry for supplying electric power including a series resonant circuit connected in shunt between the electrode and the impedance matching network associated with the source having the frequency F1, the series resonant circuit having a frequency between F1 and F2 so as to have no substantial effect on the power coupled to the plasma at any of the frequencies above F1 while assisting in providing impedance matching of the source having the frequency F1 to parasitic impedance associated with the electrode.

39. The vacuum plasma processor of claim 38 wherein the circuitry for supplying electric power includes (N−1) filters respectively associated with the sources 2 to N, the (N−1) filters being respectively arranged for enabling electric power from the sources 2 to N to be coupled without substantial attenuation to the electrode or reactance while substantially attenuating power from source 1 and for preventing power from the source 1 from being coupled to sources 2 to N.

40. The vacuum plasma processor of claim 39 wherein each of the filters includes an inductor connected in shunt between the source associated with the filter and the impedance matching network associated with the source.

41. A vacuum plasma processor for processing a workpiece comprising:

a vacuum plasma processing chamber including an electrode, the chamber being associated with a reactance, the electrode and reactance being arranged for coupling plasma excitation fields to gas in the chamber, the chamber being arranged for carrying a workpiece, N sources of radio frequency electric power, where N is an integer having a value of at least three, each of the sources being arranged for deriving a different radio frequency such that source i is arranged to derive a radio frequency Fi, where i is sequentially each integer from 1 to N, frequency F1 being the lowest frequency, frequency FN being the highest frequency, and the frequencies increasing in order from F1 to FN, and circuitry for supplying electric power at the N frequencies from the N sources of radio frequency electric power to a region of the chamber via the electrode and reactance, the N frequencies, the power at each of the N frequencies, the electrode, the reactance, and the circuitry being arranged for (a) causing the plasma to be excited to each of the N frequencies and (b) preventing substantial coupling of power to each of said N sources at a frequency other than the frequency associated with a particular radio frequency electric power source, the circuitry including N impedance matching networks, each impedance matching network being associated with one of the sources and being arranged for (a) coupling plasma excitation power at the frequency of the source with which it is associated to the electrode and (b) attenuating power at the frequencies of the other sources sufficiently to prevent substantial coupling of power at the frequencies of the other sources coupled to the source associated with the matching network, the circuitry for supplying electric power including (N−1) filters respectively associated with the sources 2 to N, the (N−1) filters being respectively arranged for enabling electric power from the sources 2 to N to be coupled without substantial attenuation to the electrode or reactance while substantially attenuating power from source 1 and for preventing power from the source 1 from being coupled to sources 2 to N.

42. The vacuum plasma processor of claim 41 wherein each of the filters includes an inductor connected in shunt between the source associated with the filter and the impedance matching network associated with the source.

43. A vacuum plasma processor for processing a workpiece comprising:

a vacuum plasma processing chamber including an electrode, the chamber being associated with a reactance, the electrode and reactance being arranged for coupling plasma excitation fields to gas in the chamber, the chamber being arranged for carrying a workpiece, N sources of radio frequency electric power, where N is an integer having a value of at least three, each of the sources being arranged for deriving a different radio frequency such that source i is arranged to derive a radio frequency F1, where i is sequentially each integer from 1 to N, frequency F1 being the lowest frequency, frequency FN being the highest frequency, and the frequencies increasing in order from F1 to FN, and circuitry for supplying electric power at the N frequencies from the N sources of radio frequency electric power to a region of the chamber via the electrode and reactance, the N frequencies, the power at each of the N frequencies, the electrode, the reactance, and the circuitry being arranged for (a) causing the plasma to be excited to each of the N frequencies and (b) preventing substantial coupling of power to each of said N sources at a frequency other than the frequency associated with a particular radio frequency electric power source, the circuitry including (N+k) impedance matching networks, where k is an integer less than N, each of the N impedance matching networks being associated with one of the sources and being arranged for (a) coupling plasma excitation power at the frequency of the source with which it is associated to the electrode and (b) attenuating power at the frequencies of the other sources sufficiently to prevent substantial coupling of power at the frequencies of the other sources coupled to the source associated with the matching network, each of the k impedance matching networks being associated with one of k of the sources and arranged for (a) coupling plasma excitation power at the frequency with which it is associated to the reactance and (b) attenuating power at the frequencies of the other (k−1) sources sufficiently to prevent substantial coupling of power at the frequencies of the other (k−1) source to the source associated with the matching network, and a switching arrangement for supplying power (a) from the N sources to the electrode via the N matching networks or (b) from (i)j of the k sources to the reactance via j of the matching networks, and (ii) m of the sources to the electrode via m of the matching networks, where j is any integer from 1 to k and m is any integer from 1 to (N−k).

44. The processor in accordance with claim 43 wherein N=3, j=k=1, m=2.

45. A vacuum plasma processor for processing a work piece comprising a vacuum plasma process chamber including top and bottom electrodes, the electrodes being arranged for coupling plasma excitation fields to gas in the chamber, the chamber being arranged for carrying a workpiece above the bottom electrode, and three sources of radio frequency electric power, for causing the workpiece to be substantially closer to the bottom electrode than the top electrode; each of the sources being arranged for deriving a different radio frequency such that source 1 is arranged to derive a radio frequency F1, source 2 is arranged to derive a radio frequency F2, and source 3 is arranged to derive a radio frequency F3, where frequency F1 is the lowest frequency, frequency F3 is the highest frequency, and frequency F2 is between F1 and F2, and circuitry for supplying electric power from the three sources at the three frequencies to a region of the chamber via the electrodes, the circuitry being arranged for (a) causing the plasma to be excited to each of the three frequencies and (b) preventing substantial coupling of power to each of the sources at a frequency other than the frequency associated with the particular source, the circuitry including three impedance matching networks, each impedance matching network being associated with one of the sources and being arranged for (a) coupling plasma excitation power at the frequency of the source with which it is associated to the region via the electrodes and (b) attenuating power at the frequencies of the other sources sufficiently to prevent substantial coupling of power at the frequencies of the other sources to the source associated with the matching network, each impedance matching network including a component with a series inductance, the impedance matching network associated with source 2 having a series inductance less than the series inductance of the impedance matching network associated with source 1, the impedance matching network associated with source 3 having a series inductance less than the series inductance of the impedance matching network associated with source 2.

46. The vacuum plasma processor of claim 45 wherein the circuitry for supplying electric power includes a series resonant circuit connected in shunt between the impedance matching network associated with source 1 and the bottom electrode, the series resonant circuit having a frequency between F1 and F2 so as to have no substantial effect on the power coupled to the plasma at any of the frequencies above F1 while assisting in providing impedance matching of source 1 to parasitic impedance associated with the bottom electrode.

47. The vacuum plasma processor of claim 46 wherein each of the impedance matching networks includes a series capacitor and a shunt capacitor.

48. The vacuum plasma processor of claim 47 wherein the series capacitors of the matching networks associated with sources with sources 2 and 3 are connected in series circuits between the shunt capacitors of the associated matching networks and the bottom electrode and the series capacitor of the associated matching network associated with source 1 is connected in a series circuit between source 1 and the shunt capacitor of the matching network associated with source 1.

49. The vacuum plasma processor of claim 47 wherein the circuitry for supplying electric power includes first and second filters respectively associated with sources 2 and 3, the first and second filters being respectively arranged for enabling electric with sources 2 and 3 to be coupled without substantial attenuation to the bottom electrode and for substantially preventing power from source 1 from being coupled to sources 2 and 3.

50. The vacuum plasma processor of claim 49 wherein the first and second filters respectively include first and second inductors respectively connected in shunt with output terminals of sources 2 and 3.

51. The vacuum plasma processor of claim 45 wherein the circuitry for supplying electric power includes first and second filters respectively associated with sources 2 and 3, the first and second filters being respectively arranged for enabling electric with sources 2 and 3 to be coupled without substantial attenuation to the bottom electrode and for substantially preventing power from source 1 from being coupled to sources 2 and 3.

52. The vacuum plasma processor of claim 45 wherein the three frequencies are such that F2>2F1, and F3>2F2.

53. The vacuum plasma processor of claim 45 wherein the sources have fixed frequency and impedances of the circuitry have fixed values during processing of a workpiece in accordance with to a particular recipe.

54. A vacuum plasma processor for processing a work piece comprising a vacuum plasma process chamber including top and bottom electrodes, the electrodes being arranged for coupling plasma excitation fields to gas in the chamber, the chamber being arranged for carrying a workpiece above the bottom electrode, three sources of radio frequency electric power, for causing the workpiece to be substantially closer to the bottom electrode than the top electrode; each of the sources being arranged for deriving a different radio frequency such that source 1 is arranged to derive a radio frequency F1 source 2 is arranged to derive a radio frequency F2, and source 3 is arranged to derive a radio frequency F3, where frequency F1 is the lowest frequency, frequency F3 is the highest frequency, and frequency F2 is between F1 and F2, circuitry for supplying electric power from the three sources at the three frequencies to a region of the chamber via the electrodes, the circuitry being arranged for (a) causing the plasma to be excited to each of the three frequencies and (b) preventing substantial coupling of power to each of said the sources at a frequency other than the frequency associated with the particular source, the circuitry including three impedance matching networks, each impedance matching network being associated with one of the sources and being arranged for (a) coupling plasma excitation power at the frequency of the source with which it is associated to the region via the electrodes and (b) attenuating power at the frequencies of the other sources sufficiently to prevent substantial coupling of power at the frequencies of the other sources to the source associated with the matching network, and the circuitry for supplying electric power including a series resonant circuit connected in shunt between the bottom electrode and the impedance matching network associated with source 1, the series resonant circuit having a resonant frequency between F1 and F2 so as to have no substantial effect on the power coupled to the plasma at any of the frequencies above F1 while assisting in providing impedance matching of source 1 to parasitic impedance associated with the bottom electrode.

55. The vacuum plasma processor of claim 54 wherein the circuitry for supplying electric power includes first and second filters respectively associated with sources 2 and 3, the first and second filters being respectively arranged for enabling electric with sources 2 and 3 to be coupled without substantial attenuation to the bottom electrode and for substantially preventing power from source 1 from being coupled to sources 2 and 3.

56. The vacuum plasma processor of claim 54 wherein the three frequencies are such that F2>2F1, and F3>2F2.

57. The vacuum plasma processor of claim 54 wherein the sources have fixed frequency and impedances of the circuitry have fixed values during processing of a workpiece in accordance with to a particular recipe.

58. A vacuum plasma processor for processing a work piece comprising
 a vacuum plasma process chamber including top and bottom electrodes, the electrodes being arranged for coupling plasma excitation fields to gas in the chamber, the chamber being arranged for carrying a workpiece above the bottom electrode, and
 three sources of radio frequency electric power, for causing the workpiece to be substantially closer to the bottom electrode than the top electrode; each of the sources being arranged for deriving a different radio frequency such that source 1 is arranged to derive a radio frequency F1, source 2 is arranged to derive a radio frequency F2, and source 3 is arranged to derive a radio frequency F3, where frequency F1 is the lowest frequency, frequency F3 is the highest frequency, and frequency F2 is between F1 and F2,
 circuitry for supplying electric power from the three sources at the three frequencies to a region of the chamber via the electrodes, the circuitry being arranged for (a) causing the plasma to be excited to each of the three frequencies and (b) preventing substantial coupling of power to each of said the sources at a frequency other than the frequency associated with the particular source,
 the circuitry including three impedance matching networks, each impedance matching network being associated with one of the sources and being arranged for (a) coupling plasma excitation power at the frequency of the source with which it is associated to the region via the electrodes and (b) attenuating power at the frequencies of the other sources sufficiently to prevent substantial coupling of power at the frequencies of the other sources to the source associated with the matching network, and
 the circuitry for supplying electric power including first and second filters respectively associated with sources 2 and 3, the first and second filters being respectively arranged for enabling electric power from sources 2 and 3 to be coupled without substantial attenuation to the bottom electrode and for substantially attenuating power from source 1 so as to substantially prevent power from source 1 from being coupled to sources 2 and 3.

59. The vacuum plasma processor of claim 58 wherein each of the filters includes an inductor connected in shunt between the source associated with the filter and the impedance matching network associated with the source.

60. The vacuum plasma processor of claim 58 wherein the sources have fixed frequency and impedances of the circuitry have fixed values during processing of a workpiece in accordance with a particular recipe.

61. A vacuum plasma processor for processing a workpiece comprising:
 a vacuum plasma processing chamber including top and bottom electrodes for coupling plasma excitation fields to gas in the chamber, the chamber being arranged for carrying a workpiece above the bottom electrode and for causing the workpiece to be substantially closer to the bottom electrode than to the top electrode,
 first, second and third sources of radio frequency electric power respectively having frequencies of approximately 2MHz, 27 MHz and 60 MHz, circuitry for supplying electric power at the approximately 2 MHz, 27 MHz and 60 MHz, frequencies from the first, second, and third sources of radio frequency electric power to the bottom electrode,
 the frequencies, the power at each of the frequencies, the electrodes, and the circuitry being arranged for (a) causing the plasma to be excited to each of the frequencies and (b) preventing substantial coupling of power to each of said sources at a frequency other than the frequency associated with the radio frequency of the particular source,
 the circuitry including first, second and third impedance matching networks respectively associated with first, second and third sources, each of the first second and third impedance matching networks being arranged for (a) coupling plasma excitation power at the frequency of the source with which it is associated to the bottom electrode and (b) attenuating power at the frequencies of the other sources sufficiently to prevent substantial coupling of power at the frequencies of the other sources to the source associated with the matching network, each of the impedance matching networks including a fixed series capacitor, a variable shunt capacitor and a component including an inductance connected in a series circuit between the associated matching network and the electrode,
 a controller arrangement for controlling the value of each of the variable shunt capacitors in response to a stored recipe for the value of the capacitor for different chamber operating conditions and for controlling the frequencies of the sources based on a measure of impedance matching between each source and the load the particular source drives,
 the impedance matching networks associated with the first and second sources including inductors connected in a series circuit between the respective sources and the electrode, the impedance matching network associated with the third source including a distributed inductance, the inductor of the impedance matching network associated with the second source having an inductance substantially greater than the distributed inductance of the impedance matching network associated with the third source, the inductor of the impedance matching network associated with the first source having an inductance substantially greater than the inductance of the impedance matching network associated with the second source, the circuitry for supplying electric power including first and second shunt inductors respectively connected across output terminals of the second and third sources, the first and second shunt inductors respectively arranged for enabling electric power from the second and third sources to be coupled without substantial attenuation to the bottom electrode while substantially attenuating power from the 2 MHz source and preventing power from the first source from being coupled to the second source and the third source, and the circuitry for supplying electric power including a series resonant circuit connected in shunt between the impedance matching network associated with the first source and the electrode, the series resonant circuit having a resonant frequency at least one octave above 2 MHz and at least one octave below 27 MHz.

62. The vacuum plasma processor of claim 61 further including circuitry for connecting the top electrode to RF ground.

63. The vacuum plasma processor of claim 62 wherein the chamber includes third and fourth grounded electrodes respectively surrounding the top of the bottom electrodes and approximately vertically aligned with the top and bottom electrodes, and a louver arrangement for substantially confining the plasma to a region between the electrodes while enabling un-ionized gas to be exhausted from the region.

* * * * *